United States Patent
Tweet et al.

(10) Patent No.: US 7,364,989 B2
(45) Date of Patent: Apr. 29, 2008

(54) STRAIN CONTROL OF EPITAXIAL OXIDE FILMS USING VIRTUAL SUBSTRATES

(75) Inventors: Douglas J. Tweet, Camas, WA (US); Yoshi Ono, Camas, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 398 days.

(21) Appl. No.: 11/174,350

(22) Filed: Jul. 1, 2005

(65) Prior Publication Data

US 2007/0004226 A1   Jan. 4, 2007

(51) Int. Cl.
    *H01L 21/20* (2006.01)
(52) U.S. Cl. .............. 438/481; 257/632; 257/E21.182; 257/E29.193
(58) Field of Classification Search ............... 438/763, 438/785, 786, 481, 489; 257/E29.193, E21.182, 257/632, 635
See application file for complete search history.

(56) References Cited

U.S. PATENT DOCUMENTS

| | | | |
|---|---|---|---|
| 5,225,031 A | 7/1993 | McKee et al. | |
| 5,830,270 A | 11/1998 | McKee et al. | |
| 6,432,546 B1 | 8/2002 | Ramesh et al. | |
| 6,464,780 B1 | 10/2002 | Mantl et al. | |
| 6,518,609 B1 | 2/2003 | Ramesh et al. | |
| 6,562,703 B1 | 5/2003 | Maa et al. | |
| 6,610,548 B1 | 8/2003 | Ami et al. | |
| 6,642,539 B2 | 11/2003 | Ramesh et al. | |
| 6,746,902 B2 | 6/2004 | Maa et al. | |
| 7,045,412 B2 * | 5/2006 | Sugii et al. | 438/229 |
| 7,273,657 B2 * | 9/2007 | Atanackovic | 428/446 |

OTHER PUBLICATIONS

Hollander et al., *Strain relaxation of pseudomorphic $Si_{1-x}Ge_x/Si(100)$ heterostructures after Si+ ion implantation*, J. Appl. Phys., vol. 96, pp. 1745-1747 (2004).

Cai et al., *Strain relaxation and threading dislocation density in helium-implanted and annealed $Si_{1-x}Ge_x/Si(100)$ heterostructures*, J. Appl. Phys., vol. 95, pp. 5347-5351 (2004).

(Continued)

*Primary Examiner*—Quoc Hoang
(74) *Attorney, Agent, or Firm*—Law Office of Gerald Maliszewski; Gerald Maliszewski

(57) ABSTRACT

A method of controlling strain in a single-crystal, epitaxial oxide film, includes preparing a silicon substrate; forming a silicon alloy layer taken from the group of silicon alloy layer consisting of $Si_{1-x}Ge_x$ and $Si_{1-y}C_y$ on the silicon substrate; adjusting the lattice constant of the silicon alloy layer by selecting the alloy material content to adjust and to select a type of strain for the silicon alloy layer; depositing a single-crystal, epitaxial oxide film, by atomic layer deposition, taken from the group of oxide films consisting of perovskite manganite materials, single crystal rare-earth oxides and perovskite oxides, not containing manganese; and rare earth binary and ternary oxides, on the silicon alloy layer; and completing a desired device.

20 Claims, 2 Drawing Sheets

OTHER PUBLICATIONS

Lim et al., *Synthesis and Characterization of Volatile, Thermally Stable, Reactive Transition Metal Amidanates*, Inorg. Chem. 42, 7951-7958 (2003).

Wu et al., *Substrate induced strain effects in epitaxial $La_{0.67-x}Pr_xCa_{0.33}MnO_3$ thin films*, Journal of Applied Physics, 93, 5507 (2003).

Foo et al., *Si1-yCy/Si(001) gas-source molecular beam epitaxy from $Si_2H_6$ and $CH_3SiH_3$: Surface reaction paths and growth kinetics*, J. Appl. Phys., 93, 3944 (2003).

Hu et al., *The interface of epitaxial $SrTiO_3$ on silicon: In situ and ex situ studies*, Applied Physics Letters, 82, 203 (2003).

Mathur et al., *Mesoscopic Texture in Manganites*, Physics Today, pp. 25-30, Jan. 2003.

Zhuang et al., *Novel Colossal Magnetoresistive Thin Film Nonvolatile Resistance Random Access Memory (RRAM)*, Technical Digest of the 2002 International Electron Devices Meeting, p. 193, (2002).

Lee et al., *Effects of low-temperature Si buffer layer thickness on the growth of SiGe by molecular beam epitaxy*, J. Appl. Phys., 92, 6880 (2002).

Narayanan et al., *Interfacial oxide formation and oxygen diffusion in rare earth oxide-silicon epitaxial heterostructures*, Applied Physics Letters, 81, 4183 (2002).

Luysberg et al., *Effect of helium ion implantation and annealing on the relaxation behavior of pseudomorphic $Si_{1-x}Ge_x$ buffer layers on Si(100) substrates*, J. Appl. Phys., vol. 92, pp. 4290-4295 (2002).

Liu et al., *Epitaxial La-doped $SrTiO_3$ on silicon: A conductive template for epitaxial ferroelectrics on silicon*, Applied Physics Letters, vol. 80, No. 25, pp. 4801-4803, (2002).

Guha et al., *Lattice-matched, epitaxial, silicon-insulating lanthanum yttrium oxide heterostructures*, Applied Physics Letters, 80, 766 (2002).

Trinkaus et al., *Strain relaxation mechanism for hydrogen-implanted $Si_{1-xGex}/Si$ (100) heterostructures*, Appl. Phys. Let., 76, 24, 3552 (2000).

Konishi et al., *Orbital-State-Mediated Phase-Control of Manganites*, J. Phys. Soc. Jpn. vol. 68, No. 12, 3790 (1999).

Mantl et al., *Strain relaxation of epitaxial SiGe layers on Si (100) improved by hydrogen implantation*, Nuclear Instruments and Methods in Physics Research B 147, 29, (1999).

McKee et al., *Crystalline Oxides on Silicon: The First Five Monolayers*, Physical Review Letters, vol. 81, No. 14, pp. 3014-3017 (1998).

Currie et al., *Controlling threading dislocation densities in Ge on Si using graded SiGe layers and chemical-mechanical polishing*, Appl. Phys. Lett., 72, 1718 (1998).

Millis et al., *Quantifying strain dependence in "colossal" magnetoresistance manganites*, J. Appl. Phys., 83, 1588 (1998).

Kasper et al., *New virtual substrate concept for vertical MOS transistors*, Thin Solid Films 336, 319 (1998).

Linder et al., *Reduction of dislocation density in mismatched SiGe/Si using a low-temperature Si buffer layer*, Appl. Phys. Let., 70, 3224 (1997).

Jin et al., *Thickness dependence on magnetoresistance in La-Ca-Mn-O epitaxial films*, Applied Physics Letters, 67, 557, (1995).

Watson et al., *Relaxed, low threading defect density $Si_{0.7}Ge_{0.3}$ epitaxial layers grown on Si by rapid thermal chemical vapor deposition*, J. Appl. Phys., 75, 263 (1994).

Burns et al., *Space Groups for Solid State Scientists*, 2d Ed., Academic Press (1990).

Jirak et al., *Neutron Diffraction Study of $Pr_{1-x}Ca_xMnO_3$ Perovskites* J. of Magnetism and Magnetic Materials, 53, 153 (1985).

Matthews et al., *Defects in Epitaxial Multilayers*, J. Cryst. Growth, 27, 118 (1974).

Dismukes et al., *Lattice Parameter and Density in Germanium-Silicon Alloys*, The Journal of Physical Chemistry, vol. 68, No. 10, 3021 (1964).

\* cited by examiner

STRAIN CONTROL OF EPITAXIAL OXIDE FILMS USING VIRTUAL SUBSTRATES

FIELD OF THE INVENTION

This invention relates to high density non-volatile memory applications, and specifically to colossal magnetoresistance (CMR) applications, such as spin-injection and spin-tunneling devices, ferroelectric memory, micro-electromechanical system (MEMS), ferromagnetic, piezoelectric, pyroelectric, electro-optic or large dielectric constant applications, fabricated on virtual substrates.

BACKGROUND OF THE INVENTION

Perovskite materials have a general formula of $ABX_3$, where A is an alkali metal, an alkali earth or a rare earth; B is a transitional metal, and X is generally oxygen; Bums et al., *Space Groups for Solid State Scientists*, 2d Ed., Academic Press (1990).

In recent years there has been an explosion of interest in perovskite manganite materials, $R_{1-x}A_xMnO_3$, where R is one or more rare earths, such as lanthanum or praseodymium, and A is an alkali or alkaline earth, such as calcium, strontium or barium. This is primarily due to the discovery of colossal magnetoresistance (CMR), in which the resistance can be changed by several orders of magnitude by application of a large magnetic field. This effect occurs because the applied magnetic field drives a phase transition from an insulating paramagnetic state to a spin-aligned metallic state, Mathur et al., *Mesoscopic Texture in Manganites*, Physics Today, p. 25-30, January 2003. Because the valence electrons in some cases are fully spin-polarized, these materials may be usable in future spin-injection and spin-tunneling devices. However, these effects require cryogenic temperatures.

Another reason for the increase in interest in manganites is the discovery of a room temperature effect in which the resistance can be changed from a high to a low state via a voltage pulse, which could be utilized in high density non-volatile memories, Zhuang et al., *Novell [sic] Colossal Magnetoresistive Thin Film Nonvolatile Resistance Random Access Memory (RRAM)*, Technical Digest of the 2002 International Electron Devices Meeting, p. 193, (2002).

Providing high-quality epitaxial manganite films may be of great use in both these types of applications, however, this requires a lattice-matched substrate. Fortunately, many of these materials have lattice constants very close to that of silicon. For example, $Pr_{1-x}Ca_xMnO_3$, (Pbnm space group, orthorhombic) has lattice constant a=5.426 Å, b=5.478 Å, and c=7.679 Å for x=0.3. Lattice constants "a" and "b" are just −0.09% and +0.86% different from the silicon lattice constant of 5.431 Å, respectively, Jirak et al., *Neutron Diffraction Study of $Pr_{1-x}Ca_xMn_{O3}$ Perovskites* J. of Magnetism and Magnetic Materials, vol. 53, 153 (1985). A related perovskite, $SrTiO_3$, has a cubic lattice constant of 3.905 Å. This is only 1.7% larger than the Si(110) distance of 3.840 Å, so growth on Si(100) may be accomplished with a 45° rotation of the perovskite lattice.

Consequently, numerous researchers have proposed ways to deposit nominally single crystal rare-earth oxides and perovskite oxides, not containing manganese, epitaxially on silicon for CMR, as well as for ferroelectric memory, micro-electro-mechanical system (MEMS), ferromagnetic, piezoelectric, pyroelectric, electro-optic or large dielectric constant applications, U.S. Pat. No. 6,642,539, to Ramesh et al., granted Nov. 4, 2003, for Epitaxial template and barrier for the integration of functional thin film metal oxide heterostructures on silicon; U.S. Pat. No. 6,518,609, to Ramesh, granted Feb. 11, 2003, for Niobium or vanadium substituted strontium titanate barrier intermediate a silicon underlayer and a functional metal oxide film; U.S. Pat. No. 6,432,546 to Ramesh et al., granted Aug. 13, 2002, for Microelectronic piezoelectric structure and method of forming the same; Liu et al., Epitaxial La-doped $SrTiO_3$ on silicon: A conductive template for epitaxial ferroelectrics on silicon, App Phy Let, vol. 80, no. 25, pp. 4801-4803, (2002); U.S. Pat. No. 6,610,548, to Ami et al., granted Aug. 26, 2003, for Crystal growth method of oxide, cerium oxide, promethium oxide, multi-layered structure of oxides, manufacturing method of field effect transistor, manufacturing method of ferroelectric non-volatile memory and ferroelectric non-volatile memory; U.S. Pat. No. 5,225,031, to McKee et al., granted Jul. 6, 1993, for Process for depositing an oxide epitaxially onto a silicon substrate and structures prepared with the process; U.S. Pat. No. 5,830,270, to McKee et al., granted Nov. 3, 1998, for $CaTiO_3$ Interfacial template structure on semiconductor-based material and the growth of electroceramic thin-films in the perovskite class; McKee et al., Crystalline Oxides on Silicon: The First Five Monolayers, Physical Review Letters, vol. 81, no. 14, pp. 3014-3017 (1998); and Hu et al., The interface of epitaxial $SrTiO_3$ on silicon: In situ and ex situ studies, App Phy Let, vol. 82, 203 (2003). The deposition method is usually ultra-high vacuum molecular-beam epitaxy (UHV-MBE), at least to grow the initial atomic layers of the epitaxial film. For example, $SrTiO_3$ has been successfully deposited epitaxially on Si(100) using UHV-MBE with a carefully controlled deposition sequence to avoid formation of an interfacial $SiO_2$ layer, which would destroy the template for epitaxy, Hu et al., supra. Specifically, Hu et al. deposited a few monolayers of Sr on a silicon surface covered with native oxide. During heating, up to 750° C. to 850° C., the strontium reduced the native oxide, leaving only ordered strontium on the silicon surface, a Sr/Si(2×1) reconstruction. $SrTiO_3$ was then grown by co-deposition of strontium and titanium metals in an oxygen ambient with very low partial pressure ($10^{-8}$ torr to $10^{-7}$ torr), with the substrate at 300° C. to 400° C. If the substrate was heated to only 500° C., oxygen diffused through the film and led to formation of an $SiO_2$ layer at the $SrTiO_3/Si$ interface, which is undesirable. U.S. Pat. No. 5,830,270 describes epitaxial growth on silicon-germanium, as well as silicon, specifically adjusting the composition of the epitaxial oxide to minimize strain on the SiGe lattice.

Rare earth binary and ternary oxides, such as $(La_xY_{1-x})_2O_3$ have been epitaxially deposited on Si(111) substrates, Guha et al., *Lattice-matched, epitaxial, silicon-insulating lanthanum yttrium oxide heterostructures*, App Phy Let, vol. 80, 766 (2002); and Narayanan et al., *Interfacial oxide formation and oxygen diffusion in rare earth oxide-silicon epitaxial heterostructures*, App Phy Let, vol. 81, 4183 (2002). Diffusion of oxygen through the film during the high temperature growth was noted. It was also noted that, when using MBE, metal-first deposition resulted in silicidation of the surface, causing a rough oxide film nucleation. However, using oxygen-first deposition, smooth epitaxial films were formed, as evidenced by reflection high energy electron diffraction (RHEED) and x-ray diffraction (XRD), Guha et al., supra. So, in some cases oxygen-first deposition seems to work better than metal-first deposition.

Another active area of research has been the effect of strain on CMR properties, induced, for example, by deposition on different substrates, Wu et al., *Substrate induced* strain effects in epitaxial $La_{0.67-x}Pr_xCa_{0.33}Mn_{03}$ thin films, Journal of Applied Physics, vol. 93, 5507 (2003). In some cases the effects may be dramatic and the tuning delicate. A well-controlled way to adjust the strain is desired. For example, Wu, et al. studied the effect of strain on $La_{0.67-x}$ $Pr_xCa_{0.33}MnO_3$ (LPCMO), with x=0.13 to 0.27. To adjust the strain from tensile to near zero to compressive, Wu, et al. had to change the substrates, from $SrTiO_3$ to $NdGaO_3$ to $LaAlO_3$. Wu, et al. found metastable phase mixtures in the films, with the volume fractions controlled by strain. In their samples they found that large tensile strain eliminated metallic behavior. Also, they found the magnetoresistance of LPCMO at low field is increased for films under tensile strain. They conclude: "Controlling strain is the first step of constructing any successful devices based on manganite thin films."

Others have found that the metal-insulator transition can be suppressed in very thin CMR films because of strain, Jin et al., Thickness dependence on magnetoresistance in La—Ca—Mn—O epitaxial films, App Phy Let, vol. 67, 557, (1995). Theory suggests that the ferromagnetic $T_c$ is extremely sensitive to biaxial strain which can affect both the Mn—O bond distance and the Mn—O—Mn bond angle, Millis et al., Quantifying strain dependence in "colossal" magnetoresistance manganites, J. Appl. Phys., vol. 83, 1588 (1998). It has been reported that thin films of LSMO are metallic under tensile strain and insulating under compressive strain, Konishi et al., *Orbital-State-Mediated Phase-Control of Manganites*, J. Phys. Soc. Jpn. vol. 68, No. 12, 3790 (1999).

In another example, during epitaxial growth of $(La_xY_{1-x})_2O_3$ on Si(111), Guha, et al., supra, changed the lattice matching by adjusting the La:Y ratio. To minimize the strain, they also had to take thermal expansion into consideration. However, it would be desirable to minimize strain by adjusting the lattice constant of the substrate, instead of changing the composition of the epitaxial oxide, which could then change the properties of that oxide. It would also be desirable to change the strain in the substrate without having to change the type of substrate.

A different area of research has been the production of so-called "virtual substrates", in which relaxed SiGe films are fabricated on silicon substrates. The current predominant technique to produce a high quality relaxed $Si_{1-x}Ge_x$ virtual substrate is the growth of a several μm thick compositionally graded layer, Watson et al., Relaxed, low threading defect density $Si_{0.7}Ge_{0.3}$ epitaxial layers grown on Si by rapid thermal chemical vapor deposition, J. Appl. Phys., vol. 75, 263 (1994); and Currie et al., Controlling threading dislocation densities in Ge on Si using graded SiGe layers and chemical-mechanical polishing, App Phy Let, vol. 72, 1718 (1998), wherein the density of threading dislocations is typically $\sim 10^6/cm^2$.

Recently, alternative methods to efficiently relax thinner, e.g., 100 nm to 500 nm, strained SiGe layers on silicon have been sought. Atomic hydrogen ($H^+$) implantation followed by an appropriate anneal, e.g., 800° C. for several minutes, has been used to increase the degree of SiGe relaxation and to reduce the density of threading dislocations, Mantl et al., Strain relaxation of epitaxial SiGe layers on Si (100) improved by hydrogen implantation, Nuclear Instruments and Methods in Physics Research B 147, 29, (1999); Trinkaus et al., Strain relaxation mechanism for hydrogen-implanted $Si_{1-x}Ge_x/Si$ (100) heterostructures, App Phy Let, vol. 76, 24, 3552 (2000); U.S. Pat. No. 6,464,780, to Mantl et al., granted Oct. 15, 2002, for Method for the Production of a Monocrystalline Layer on a Substrate with a Non-adapted Lattice and Component containing One or Several Such Layers; and U.S. Pat. No. 6,746,902, to Maa et al., granted Jun. 8, 2004, for Method to Form Relaxed SiGe Layer with High Ge Content. Previously, we have proposed the implantation of either $H^+$ or $H_2^+$ alone or with boron, helium, silicon, or other species for the purpose of relaxing strained SiGe films deposited epitaxially on silicon substrates, U.S. patent application Ser. No. 10/936,400, of Tweet et al., filed Sep. 7, 2004, for Method to Form Relaxed SiGe Layer with High Ge Content using co-implantation of boron and hydrogen; and U.S. Pat. No. 6,562,703, to Maa et al., granted May 13, 2003, for Molecular hydrogen implantation method for forming a relaxed silicon germanium layer with high germanium content. Also, the implantation of $He^+$ alone or $Si^+$ alone have both been successful, Luysberg et al., Effect of helium ion implantation and annealing on the relaxation behavior of pseudomorphic $Si_{1-x}Ge_x$ buffer layers on Si(100) substrates, J. Appl. Phys., vol. 92, pp 4290-4295 (2002); Cai et al., Strain relaxation and threading dislocation density in helium-implanted and annealed $Si_{1-x}Ge_x/Si(100)$ heterostructures, J. Appl. Phys., vol. 95, pp 5347-5351 (2004); and Hollander et al., Strain relaxation of pseudomorphic $Si_{1-x}Ge_x/Si(100)$ heterostructures after Si+ ion implantation, J. Appl. Phys., vol. 96, pp 1745-1747 (2004).

Another method to produce a relaxed, thin SiGe virtual substrate having a low density of threading dislocations has been to grow the SiGe on a buffer layer that has an abundance of point defects, such as silicon interstitials. This has been accomplished by growing a silicon, Linder et al., Reduction of dislocation density in mismatched SiGe/Si using a low-temperature Si buffer layer, Appl. Phys. Let., vol. 70, 3224 (1997), and Lee et al., Effects of low-temperature Si buffer layer thickness on the growth of SiGe by molecular beam epitaxy, J. Appl. Phys., vol. 92, 6880 (2002), or SiGe buffer layer at low temperatures or by implantation of Si+ ions during buffer growth, Kasper et al., New virtual substrate concept for vertical MOS transistors, Thin Solid Films 336, 319 (1998).

SUMMARY OF THE INVENTION

A method of controlling strain in a single-crystal, epitaxial oxide includes preparing a silicon substrate; forming a silicon alloy layer taken from the group of silicon alloy layer consisting of $Si_{1-x}Ge_x$ and $Si_{1-y}C_y$ on the silicon substrate; adjusting the lattice constant of the silicon alloy layer by selecting the alloy material content to adjust and to select a type of strain for the silicon alloy layer; depositing a single-crystal, epitaxial oxide film, by atomic layer deposition, taken from the group of oxide films consisting of perovskite manganite materials, single crystal rare-earth oxides and perovskite oxides, not containing manganese; and rare earth binary and ternary oxides, on the silicon alloy layer; and completing a desired device.

It is an object of the invention to provide a lattice constant-adjustable substrate, which may be modified to induce tensile strain, no strain or compressive strain on the overlying single-crystal epitaxial oxide film.

Another object of the method of the invention is to provide adjustment the lattice constant of the virtual substrate by selecting the content of an "alloy" material to minimize strain in a single-crystal, epitaxial oxide film, including perovskite manganite materials, single crystal rare-earth oxides and perovskite oxides, not containing manganese; and rare earth binary and ternary oxides.

A further object of the method of the invention is to provide adjustment to the tensile or compressive strain of the lattice constant of the single-crystal, epitaxial oxide film by selecting the content of the alloy material in a virtual substrate film.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 2:
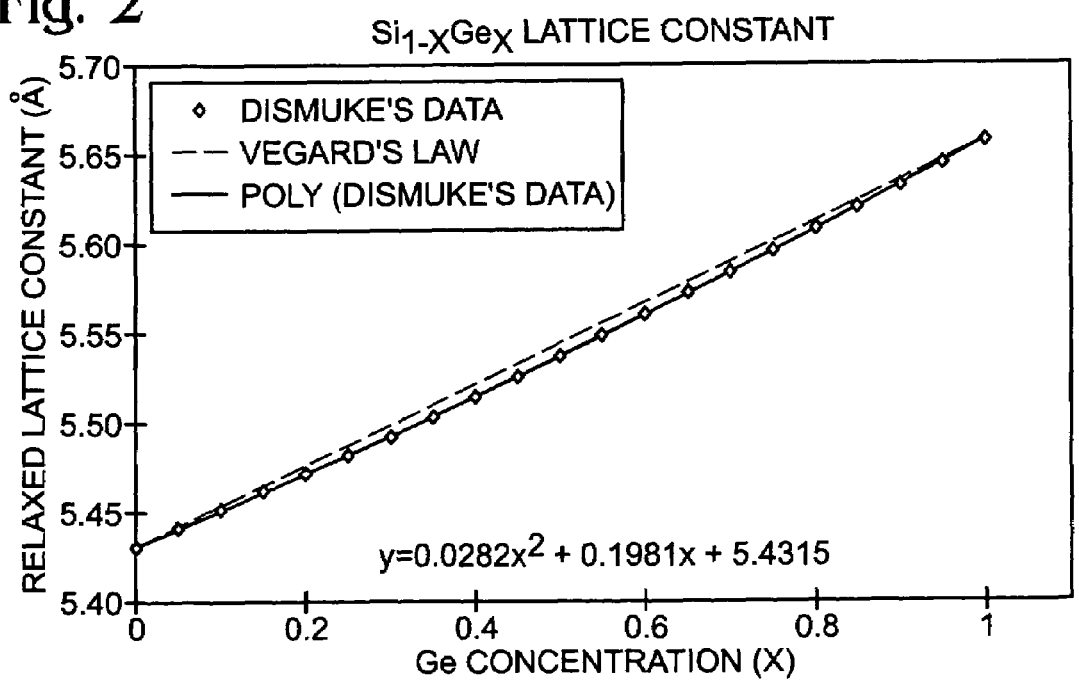
FIG. 2 depicts a lattice constant of a relaxed $Si_{1-x}Ge_x$ alloy as a function of germanium content, x.

The method of the invention provides a lattice constant-adjustable substrate, which may be modified to induce tensile strain, no strain or compressive strain. This is useful for colossal magnetoresitive (CMR) materials and oxide perovskites for use in ferroelectric memory, micro-electro-mechanical system (MEMS), ferromagnetic, piezoelectric, pyroelectric, electro-optic or large dielectric constant applications on Si(100) substrates as well as Si(111) and Si(110). This adjustment is made possible by fabricating silicon alloy films, or layer, such as a $Si_{1-x}Ge_x$ film, on a silicon wafer having an appropriate orientation and degree of relaxation. There are three groups of material which may be used on a strain-adjustable substrate fabricated according to the method of the invention: (1) perovskite manganite materials, $R_{1-x}A_xMnO_3$, where R is one or more rare earths, such as lanthanum or praseodymium; or rare earth-like elements, such as Y and Sc; and A is an alkali or alkaline earth, such as calcium, strontium or barium; (2) single crystal rare-earth oxides and perovskite oxides, not containing manganese; and (3) rare earth binary and ternary oxides, referred to herein as epitaxial oxides, which are single crystal layers. The method of the invention is useful for providing a substrate for deposition of any thin film containing oxygen and another element which has a lattice structure within 4.2% of that of the underlying silicon substrate, as shown in FIG. 2.

Adjusting the lattice constant of the virtual substrate, by selecting the germanium content, x, to minimize strain in the epitaxial oxide film improves the crystal quality of the film. Conversely, adjusting the lattice constant of the virtual substrate by selecting the germanium content allows the fabrication of epitaxial oxide films with controllable tensile or compressive strain. This may be used to modify the device properties of the films, as desired.

As previously noted, a perovskite has the general form $ABX_3$, where A may be an alkali metal, such as Li, Na, K, Rb or Cs; an alkaline earth, such as Be, Mg, Ca, Sr or Ba; or a rare earth, such as Sc, Y or La; where B is a transitional metal from periodic table groups IVA through IB.

Figure 1:
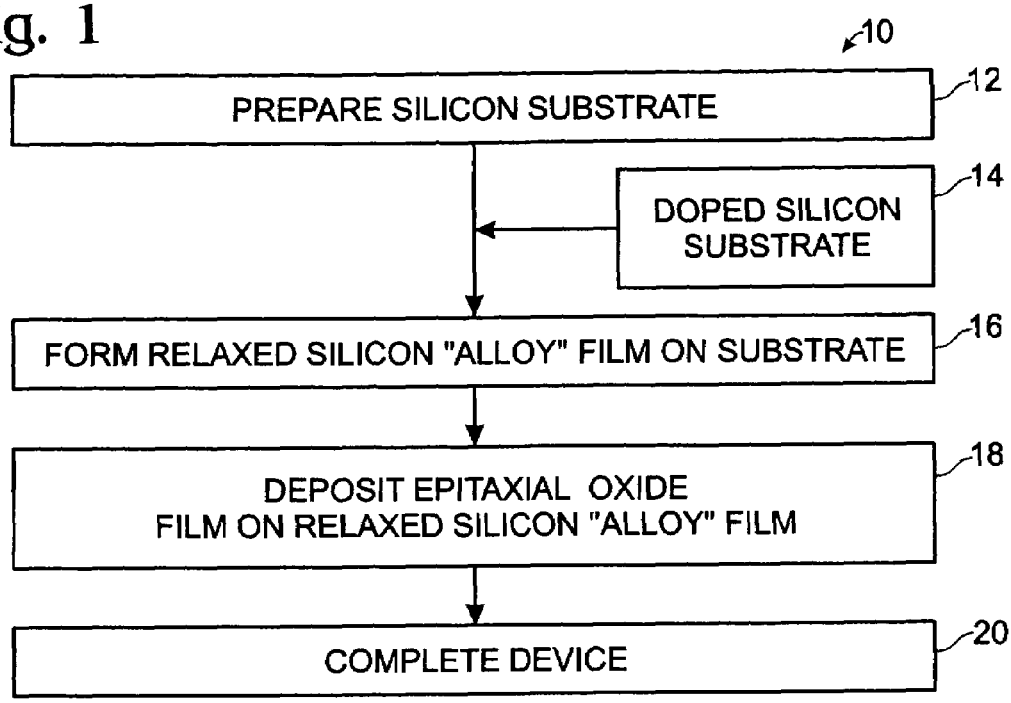
FIG. 1 is a block diagram of the method of the invention.

The method of the invention, shown generally at 10 in FIG. 1, includes preparing a clean silicon substrate, 12. The silicon orientation may be (100), (110), or (111). The (100) orientation is used herein as an example. The surface may or may not be doped, and if doped, may be either n- or p-type, depending on the needs of the application, 14.

A silicon alloy layer, or film, for example, $Si_{1-x}Ge_x$, is fabricated on the silicon substrate, 16, where germanium is referred to herein as an alloy material, having a desired lattice constant at the surface. The degree of relaxation of the SiGe virtual substrate may be adjusted to meet the requirements of the final device, and a method of adjusting the relaxation is described later herein. The SiGe alloy layer may or may not be doped to provide a desired virtual substrate. Any state-of-the-art method may be used, which methods include: a) growth of a several micron thick relaxed SiGe virtual substrate, Watson et al., and Currie et al., supra, b) growth of a relatively thin, e.g., 100 nm to 500 nm strained $Si_{1-x}Ge_x$ film, followed by implantation of $H_+$, $H_2^+$, $He^+$, $Si^+$, etc., ions and an anneal to relax the film, as described in the above-cited prior art, and c) use of low temperature growth or ion implantation to produce a compliant substrate on which a relaxed $Si_{1-x}Ge_x$ film can be grown, Linder et al., Lee et al., and Kasper et al., supra.

FIG. 2 depicts the range of lattice constants achievable with this method, Dismukes et al., Lattice Parameter and Density in Germanium-Silicon Alloys, The Journal of Physical Chemistry, vol. 68, no. 10, 3021 (1964). It is a plot of the lattice constant of a completely relaxed $Si_{1-x}Ge_x$ alloy as a function of germanium content, x, from 0 (pure silicon) to 1.0 (pure germanium). The experimental data deviates slightly from "Vegard's Law", which is a simple linear interpolation between the lattice constants for silicon (5.431 Å) and germanium (5.6575 Å).

As an example, the CMR material $La_{0.7}Ca_{0.3}MnO_3$ is orthorhombic where a=5.465 Å, b=5.480 Å, and c=7.723 Å, Wu et al., supra. The a and b lattice constants are close to each other and in the range shown in FIG. 2. Deposition on pure silicon would place the films under compressive strain, while depositing on 100% relaxed $Si_{1-x}Ge_x$ would be compressive (0<x<0.18), approximately lattice-matched (0.18<x<0.24), or tensile (x>0.24). However, if the $Si_{1-x}Ge_x$ film is less than completely relaxed, the degree of relaxation in the SiGe virtual substrate needs to be taken into account, specifically, to control the strain of the epitaxial CMR or perovskite oxide layer the lattice constant of the $Si_{1-x}Ge_x$ film parallel to the surface at the surface of the $Si_{1-x}Ge_x$ film needs to be controlled; call this $a_\parallel$. Lattice relaxation may be defined as:

$$R = 100 \times \{(a_\parallel - a_{Si})/a(x) - a_{Si}\}, \quad (1)$$

where $a_{Si}$ is the lattice constant of silicon, 5.431 Å, and a(x) is the lattice constant of the completely relaxed alloy, shown in FIG. 2. If, for example, $a_\parallel$=b=5.480 Å is desired, but the surface of the $Si_{1-x}Ge_x$ film is only 80% relaxed, (R=80), then a(x)=$a_{Si}$+($a_\parallel$-$a_{Si}$)×100/R=5.4923 Å, which corresponds to x=0.30, the $Si_{1-x}Ge_x$ alloy should be grown with x=0.30. If the $Si_{1-x}Ge_x$ film is to be 100% relaxed, a(x)=$a_\parallel$=5.480 Å, corresponding to x=0.24, and the $Si_{1-x}Ge_x$ film should be grown with x=0.24. Consequently, both the germanium content and relaxation state of the $Si_{1-x}Ge_x$ film need to be taken into consideration.

Figure 3:
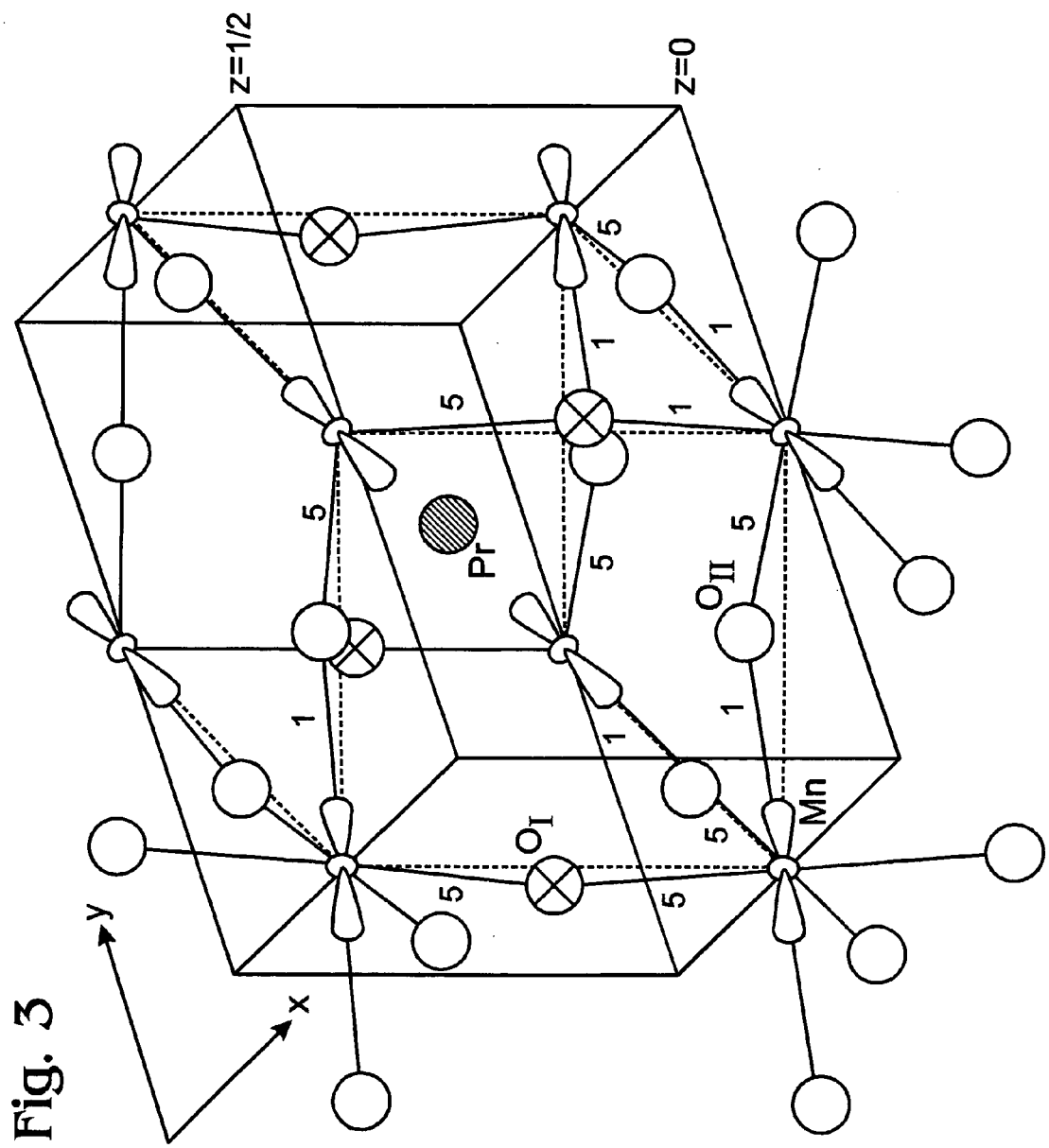
FIG. 3 depicts the crystal structure of $PrMnO_3$.

The next step in the method of the invention is to deposit the epitaxial oxide film, 18. Care must be taken to avoid formation of $SiO_2$ at the interface. As an example, FIG. 3 depicts the structure of $PrMnO_3$ according to Jirak et al., supra. The x- and y-directions shown are parallel to the <100> and <010> directions in silicon, respectively. It can be seen that it is important for manganese to be deposited first, followed by oxygen, and then by the rare earth. Any state-of-the-art technique may be used. As previously noted, growth on silicon substrates has mostly been accomplished by UHV-MBE techniques, e.g., Hu et al., Guhu et al., and Narayanan et al., supra, however, UHV-MBE techniques are not practical for commercially viable production. CVD does not provide sufficient control, and also requires high temperatures, which facilitate interfacial $SiO_2$ formation. The best choice is probably atomic layer deposition (ALD). In one variation of this method, the Si(100) surface is first exposed to a precursor containing manganese, but no oxygen, such as anhydrous $MnCl_2$, followed by a chamber purge with an inert gas. Next, the surface is exposed to an oxygen-containing precursor, typically water vapor, followed by another purge. Next, a precursor containing the rare-earth/alkaline-earth ions, and possibly oxygen, Lim et al., *Synthesis and Characterization of Volatile, Thermally Stable, Reactive Transition Metal Amidanates*, Inorg. Chem. vol. 42, 7951-7958 (2003), is used, such as a praseodymium alkoxide, followed by another purge. The whole process is then repeated. Another advantage of ALD is the low temperatures used, e.g., 200° C. to 300° C. This low temperature fabrication inhibits interfacial $SO_2$ formation via oxygen diffusion. Once a seed layer is established, for example, 10 to 50 unit cells, the growth method may be switched to a faster technique, such as MOCVD.

If strained films are desired, care must be taken not to make them too thick, because, beyond a critical thickness, which depends on strain, the material, and temperature, threading dislocations could be nucleated, causing the strain to relax and the film quality diminished, Matthews et al., *Defects in Epitaxial Multilayers*, J. Cryst. Growth, 27, 118 (1974). Thus, "too thick" is that thickness where threading dislocations are nucleated, causing the strain to relax.

As an alternative to $Si_{1-x}Ge_x$ if the desired lattice constant is a few percent smaller than that of silicon (5.431 Å), a relaxed, $Si_{1-y}C_y$ film may be used, with y~0.001 to 0.03, Foo et al., $Si_{1-y}C_y/Si(001)$ gas-source molecular beam epitaxy from $Si_2H_6$ and $CH_3SiH_3$: Surface reaction paths and growth kinetics, J. Appl. Phys., vol. 93, 3944 (2003). Once the epitaxial oxide layer is fabricated, the substrate and the epitaxial oxide layer may be used to complete a desired device, 20.

Thus, a method for forming a lattice constant-adjustable virtual substrate has been disclosed. It will be appreciated that further variations and modifications thereof may be made within the scope of the invention as defined in the appended claims.

We claim:

1. A method of controlling strain in a single-crystal, epitaxial oxide film, comprising:
   preparing a silicon substrate;
   forming a silicon alloy layer overlying and in direct contact with the silicon substrate;
   depositing a single-crystal, epitaxial oxide film, taken from the group of oxide films consisting of perovskite manganite materials; single crystal rare-earth oxides and perovekite oxides, not containing manganese; and rare earth binary and ternary oxides, overlying and in direct contact with the silicon alloy layer; and
   completing a desired device.

2. The method of claim 1 which further includes doping the silicon substrate prior to said forming a silicon alloy layer on the silicon substrate.

3. The method of claim 2 wherein said doping is taken from the types of doping consisting of n-type doping and p-type doping.

4. The method of claim 1 which further includes doping the silicon alloy layer prior to said deposing an oxide film on the silicon alloy film.

5. The method of claim 4 wherein said doping is taken from the types of doping consisting of n-type doping and p-type doping.

6. The method of claim 1 wherein said forming a silicon alloy layer on the silicon substrate includes forming a silicon alloy layer taken from the group of silicon alloy layers consisting of $Si_{1-x}Ge_x$ and $Si_{1-y}C_y$.

7. The method of claim 1 which includes adjusting the lattice constant of the silicon alloy layer by selecting the alloy material content to adjust and to select a type of strain for the silicon alloy layer, resulting in a deposited oxide film having a desired lattice constant and strain.

8. The method of claim 1 wherein said depositing an oxide film includes depositing an oxide film by atomic layer deposition.

9. The method of claim 8 wherein said depositing an oxide film by atomic layer deposition includes low temperatures atomic layer deposition at a temperature of between about 200° C. to 300° C. to inhibit interfacial $SiO_2$ formation via oxygen diffusion.

10. A method of controlling strain in a single-crystal, epitaxial oxide film, comprising:
    preparing a silicon substrate;
    forming a SiGe alloy layer overlying and in direct contact with the silicon substrate;
    depositing a single-crystal, epitaxial oxide film, taken from the group of oxide films consisting of perovakite manganite materials, single crystal rare-earth oxides and perovskite oxides, not containing manganese; and rare earth binary and ternary oxides, overlying and in direct contact with the silicon alloy layer;
    controlling strain in the single-crystal, epitaxial oxide film; and
    completing a desired device.

11. The method of claim 10 wherein said forming a SiGe alloy layer on the silicon substrate includes forming a $Si_{1-x}Ge_x$ layer.

12. The method of claim 10 which includes adjusting the lattice constant of the SiGe alloy layer by selecting the alloy material content to adjust and to select a type of strain for the SiGe alloy layer, resulting in a deposited oxide film having a desired lattice constant and strain.

13. The method of claim 10 wherein said depositing an oxide film includes depositing an oxide film by atomic layer deposition.

14. The method of claim 13 wherein said depositing an oxide film by atomic layer deposition includes low temperature atomic layer deposition at a temperature of between about 200° C. to 300° C. to inhibit interfacial $SiO_2$ formation via oxygen diffusion.

15. The method of claim 10 which further includes doping the silicon substrate prior to said forming a silicon alloy layer on the silicon substrate, wherein said doping is taken from the types of doping consisting of n-type doping and p-type doping.

16. The method of claim 10 which further includes doping the SiGe alloy layer prior to said deposing an oxide film on the SiGe alloy film, wherein said doping is taken from the types of doping consisting of n-type doping and p-type doping.

17. A method of controlling strain in a single-crystal, epitaxial oxide film, comprising:
    preparing a silicon substrate;
    forming a forming a silicon alloy layer taken from the group of silicon alloy layers consisting of $Si_{1-x}Ge_x$ and $Si_{1-y}C_y$ overlying and in direct contact with the silicon substrate;

adjusting the lattice constant of the silicon alloy layer by selecting the alloy material content to adjust and to select a type of strain for the silicon alloy layer;

depositing a single-crystal, epitaxial oxide film, by atomic layer deposition, taken from the group of oxide films consisting of perovskite manganite materials, single crystal rare-earth oxides and perovskite oxides, not containing manganese; and rare earth binary and ternary oxides, overlying and in direct contact with the silicon alloy layer; and completing a desired device.

18. The method of claim 17 wherein said depositing an oxide film by atomic layer deposition includes low temperatures atomic layer deposition at a temperature of between about 200° C. to 300° C. to inhibit interfacial $SiO_2$ formation via oxygen diffusion.

19. The method of claim 17 which further includes doping the silicon substrate prior to said forming a silicon alloy layer on the silicon substrate, wherein said doping is taken from the types of doping consisting of n-type doping and p-type doping.

20. The method of claim 17 which further includes doping the silicon alloy layer prior to said depositing an oxide film on the silicon alloy film, wherein said doping is taken from the types of doping consisting of n-type doping and p-type doping.

* * * * *